United States Patent
Shrivastava et al.

(10) Patent No.: US 10,476,542 B1
(45) Date of Patent: Nov. 12, 2019

(54) CONTINUOUS TIME LINEAR CAPACITIVE DIGITAL STEP ATTENUATOR

(71) Applicant: TEXAS INSTRUMENTS INCORPORATED, Dallas, TX (US)

(72) Inventors: Neeraj Shrivastava, Bengaluru (IN); Rajendrakumar Joish, Bengaluru (IN); Shagun Dusad, Bengaluru (IN); Visvesvaraya Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/274,621

(22) Filed: Feb. 13, 2019

Related U.S. Application Data (60) Provisional application No. 62/786,113, filed on Dec. 28, 2018.

(51) Int. Cl.
*H04B 1/04* (2006.01)
*H04B 1/18* (2006.01)
*H03K 17/94* (2006.01)
*H03K 19/173* (2006.01)

(52) U.S. Cl.
CPC ............. *H04B 1/18* (2013.01); *H03K 17/94* (2013.01); *H03K 19/1733* (2013.01)

(58) Field of Classification Search
CPC ................................. H04B 1/18; H03K 17/94
See application file for complete search history.

(56) References Cited

U.S. PATENT DOCUMENTS

| | | | |
|---|---|---|---|
| 2016/0099743 A1* | 4/2016 | Kolcuoglu | H04B 1/48 455/78 |
| 2016/0118959 A1* | 4/2016 | Atesal | H03H 11/245 333/81 R |

\* cited by examiner

*Primary Examiner* — Tuan H Nguyen
(74) *Attorney, Agent, or Firm* — John R. Pessetto; Charles A. Brill; Frank D. Cimino (57) ABSTRACT

A digital step attenuator (DSA) includes a switch control circuit which receives the attenuated signal output by the DSA from a buffer and generates a tracked control signal for switches within the DSA. Some switch control circuits include a capacitor coupled to receive the buffered signal, a supply voltage, and a switch control logic sub-circuit for each switch. Each switch control logic sub-circuit receives a control signal, for either the gate or the bulk terminal of the switch, and generates the tracked control signal. In other embodiments, switch control circuits include a complementary MOSFET switching device coupled to receive a control signal, and a capacitor coupled to receive the buffered signal, both of which are connected to an output terminal for the tracked control signal. In those embodiments, the DSA includes a switch control circuit for each switch connected to the DSA output.

26 Claims, 5 Drawing Sheets

CONTINUOUS TIME LINEAR CAPACITIVE DIGITAL STEP ATTENUATOR

RELATED APPLICATIONS

This application claims priority to U.S. Provisional Application No. 62/786,113 filed Dec. 28, 2018, which is hereby incorporated by reference.

BACKGROUND

Recent advancements in wireless communications require radio frequency (RF) receivers to support a wide dynamic range of analog input signals. Digital step attenuators (DSAs) are widely used in RF receivers with wideband and multiband applications to reduce the power of analog input signals without substantially changing the waveforms. The attenuated input signals are then input to other components in RF receivers, which are protected from the initial power of the analog input signal. A DSA is an analog attenuator whose attenuation is controlled digitally, and can be integrated within an associated RF receiver or external to ft. Due to the high dynamic range of analog input signals received by RF receivers, some DSAs struggle to support a wide signal bandwidth and amplitude range. Further, some DSAs enable a large range of attenuations and support large output signal swing but exhibit non-linearity and high noise figures.

SUMMARY

In some examples, a computing device includes a processing unit, a memory module coupled to the processing unit, and an RF receiver coupled to the processing unit and the memory module. The RF receiver includes an input driver configured to receive a coarse signal and generate an input signal, a DSA coupled to the input driver and configured to receive the input signal and generate an attenuated signal, a buffer coupled to the DSA and configured to receive the attenuated signal and output the attenuated signal substantially unchanged, and an analog to digital converter (ADC) coupled to the buffer and configured to receive the attenuated signal from the buffer and generate an output signal. The RF receiver also includes a DSA switch control circuit coupled to the buffer and configured to receive the attenuated signal from the buffer and generate a tracked control signal, which is provided to a terminal of one or more switches within the DSA.

In some examples, the DSA switch control circuit includes an input terminal configured to receive the attenuated signal from the buffer, a coupling capacitor coupled to the input terminal and a first node, a resistor coupled to a first fixed supply voltage and the first node, and a switch control logic sub-circuit for each switch within the DSA. Each switch control logic sub-circuit is connected to the first node and configured to receive a control signal for its switch, either for the gate terminal or the bulk terminal, and generate the tracked control signal for its switch. Each switch control logic sub-circuit includes a first transistor configured to receive the control signal for the associated switch and coupled to the first node and an output node, and a second transistor configured to receive the control signal for the associated switch and coupled to a second fixed supply voltage and the output node. The output node is coupled to the associated switch and provides the tracked control signal to a gate terminal or a bulk terminal of the associated switch respectively.

In other examples, the DSA includes a DSA switch control circuit for each switch within the DSA connected to the DSA output node. Each DSA switch control circuit includes a first transistor configured to receive a control signal for its switch and coupled to a first fixed supply voltage and an output terminal, a second transistor configured to receive the gate control signal for its switch and coupled to a second fixed supply voltage and the output terminal, an input terminal configured to receive the attenuated signal from the buffer, and a coupling capacitor coupled to the output terminal and the input terminal. The output terminal is coupled to the associated switch and provides the tracked control signal to a gate terminal of the switch.

BRIEF DESCRIPTION OF THE DRAWINGS

For a detailed description of various examples, reference will now be made to the accompanying drawings in which.

DETAILED DESCRIPTION

Some radio frequency (RF) receivers receive a wide dynamic range of analog input signals. Some digital step attenuators (DSAs) struggle to support the wide signal bandwidth, wide amplitude range, and large output signal swing corresponding to this wide dynamic range of analog input signals; which leads to non-linearity and high noise figures. Non-linear behavior of components within the DSA can cause elevated output harmonics and spurious signal levels, corrupting the attenuated output signal of the DSA. The described examples pertain to a DSA capable of supporting a wide input signal bandwidth as well as a large input signal amplitude range and large output signal swing while maintaining device linearity and low noise figures. The described examples pertain to a circuit (e.g., an integrated circuit (IC)) for a linear, low noise and high dynamic range continuous time capacitive DSA. The illustrative DSA includes a termination resistor bank, a series capacitor bank, and a shunt capacitor bank, and works in conjunction with a buffer and one or more switch control logic blocks.

The termination resistor bank includes a set of termination resistors and a set of termination switches, one for each termination resistor, which connect the associated termination resistors to a fixed voltage and change the resistor value of the termination resistor bank. The series capacitor bank includes a set of series capacitors, a set of series connect switches, one for each series capacitor, and a set of series disconnect switches, one for each series capacitor. The series connect and disconnect switches change the capacitance value of the series capacitor bank. The shunt capacitor bank includes a set of shunt capacitors, a set of shunt connect switches, one for each shunt capacitor, and a set of shunt disconnect switches, one for each shunt capacitor. The shunt connect and disconnect switches change the capacitance value of the shunt capacitor bank. The DSA receives an input signal and a digital control signal indicating the desired level of attenuation, what value each bank should be, and which switches to turn on or off. The DSA outputs an attenuated signal. The buffer receives the output of the DSA, the attenuated signal, and outputs it substantially unchanged. The one or more switch control logic blocks receive the output of the buffer and output a tracked switch control signal to one or more switches in the DSA.

In some embodiments, the switch control logic block includes an input terminal for the buffer output signal, an input terminal for a DC_ON supply voltage, a coupling capacitor, a resistor, and a switch control logic circuit for each switch in the DSA. Each switch control logic circuit is connected to an ON supply node connected to the coupling capacitor and the buffer output and the resistor and the DC_ON supply voltage. Each switch control logic circuit includes an input terminal for a control signal for the particular switch associated with the switch control logic circuit, two transistors, an input terminal for an OFF supply voltage, and an output terminal for a tracked switch control signal to the particular switch.

In some embodiments, one of the transistors is a p-type metal oxide semiconductor field effect transistor (PMOS) and its source terminal is connected to the ON supply node, its gate terminal receives the control signal for the particular switch, and the drain terminal is connected to the output terminal for the tracked gate control signal. The other transistor is an n-type metal oxide semiconductor field effect transistor (NMOS) and its source terminal is connected to the OFF supply voltage, its gate terminal receives the control signal for the particular switch, and the drain terminal is connected to the output terminal for the tracked switch control signal.

In some examples, the switch control logic circuit receives the gate control signal for the particular switch and outputs a tracked gate control signal. In other examples, the switch control logic circuit receives the bulk control signal for the particular switch and outputs a tracked bulk control signal. The switch control logic circuit for the gate control of a switch enables the gate control voltage to track the DSA output signal when the switch is on, reducing signal loss from switch parasitics and improving linearity and the noise figure of the DSA. The switch control logic circuit for the bulk control of a switch enables the bulk control voltage to track the DSA output signal when the switch is on, making the switch's threshold voltage largely constant despite fluctuations of the DSA output signal. This can further improve the DSA's linearity by keeping the switch's impedance relatively constant.

In some embodiments, the switch control logic block provides a tracked gate control signal to a single switch within the DSA and includes an input terminal for a DC_ON supply voltage, an input terminal for an OFF supply voltage, an input terminal for a gate control signal for the particular switch associated with the switch control logic block, an input terminal for the buffer output signal, and an output terminal for the tracked gate control signal. The switch control logic block also includes two transistors and a coupling capacitor.

In some embodiments, one transistor is a PMOS transistor and its source terminal receives the DC_ON supply voltage, its gate terminal receives the gate control signal for the particular switch, and its drain terminal is connected to the output terminal for the tracked gate control signal. The second transistor is an NMOS transistor and its source terminal receives the OFF supply voltage, its gate terminal receives the control signal for the particular switch, and its drain terminal is connected to the output terminal for the tracked gate control signal. The coupling capacitor is connected between the input terminal for the buffer output signal and the output terminal for the tracked gate control signal.

Because the buffer output signal is connected directly to the tracked gate control signal, the gate control signal tracks the DSA output signal in both the on and the off stages, reducing signal loss through the DSA due to switch parasitics and improving the linearity and noise figure of the DSA. In this embodiment, the switch control logic block provides a tracked gate control signal to a single switch within the DSA, requiring a separate switch control logic block for each switch connected to the DSA output.

Figure 1:
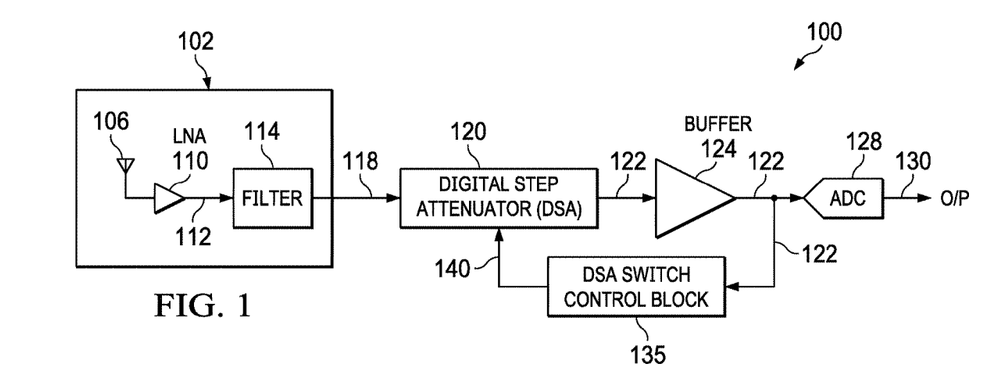
FIG. 1 shows a block diagram of an example radio frequency (RF) receiver.

FIG. 1 shows a block diagram of an example RF receiver 100. RF receiver 100 includes an input driver 102, a DSA 120, a buffer 124, an analog to digital converter (ADC) 128, and a DSA switch control block 135. The input driver 102 includes an antenna 106, a low noise amplifier (LNA) 110, and a filter 114. Filter 114 includes a matching network to output the maximum signal power to DSA 120. DSA 120 is coupled to the input driver 102 and buffer 124. ADC 128 is connected to buffer 124. In RF receiver 100, DSA switch control block 135 is coupled between buffer 124 and DSA 120. Antenna 106 in input driver 102 receives a coarse signal. LNA 110 amplifies the coarse signal to generate an amplified signal 112, which is then filtered by filter 114 to generate an input signal 118. DSA 120 receives input signal 118 and attenuates it to generate attenuated signal 122. Buffer 124 receives attenuated signal 122 and outputs it without substantial alteration.

ADC 128 receives attenuated signal 122 from buffer 124 and generates an output signal 130. DSA switch control block 135 receives attenuated signal 122 from buffer 124 and generates one or more switch control signals 140 which it provides to DSA 120. The attenuated signal 122 from DSA 120 cannot be input directly to terminals of switches within DSA 120 or to DSA switch control block 135 because it would load the output terminal of DSA 120 and contribute to signal loss in a 0 dB attenuation setting. Instead, the attenuated signal 122 is passed through buffer 124, leaving the attenuated signal 122 largely the same but guarding the DSA switch control block 135 and terminals of switches within DSA 120 from unwanted load. Switch control signal 140 tracks the attenuated signal 122 to improve linearity and reduce noise within DSA 120. In some examples, DSA 120 applies switch control signal 140 to gate terminals associated with one or more switches in DSA 120 connected to the DSA output. In other examples, DSA 120 applies switch control signal 140 to bulk terminals associated with one or more switches in DSA 120.

Figure 2:
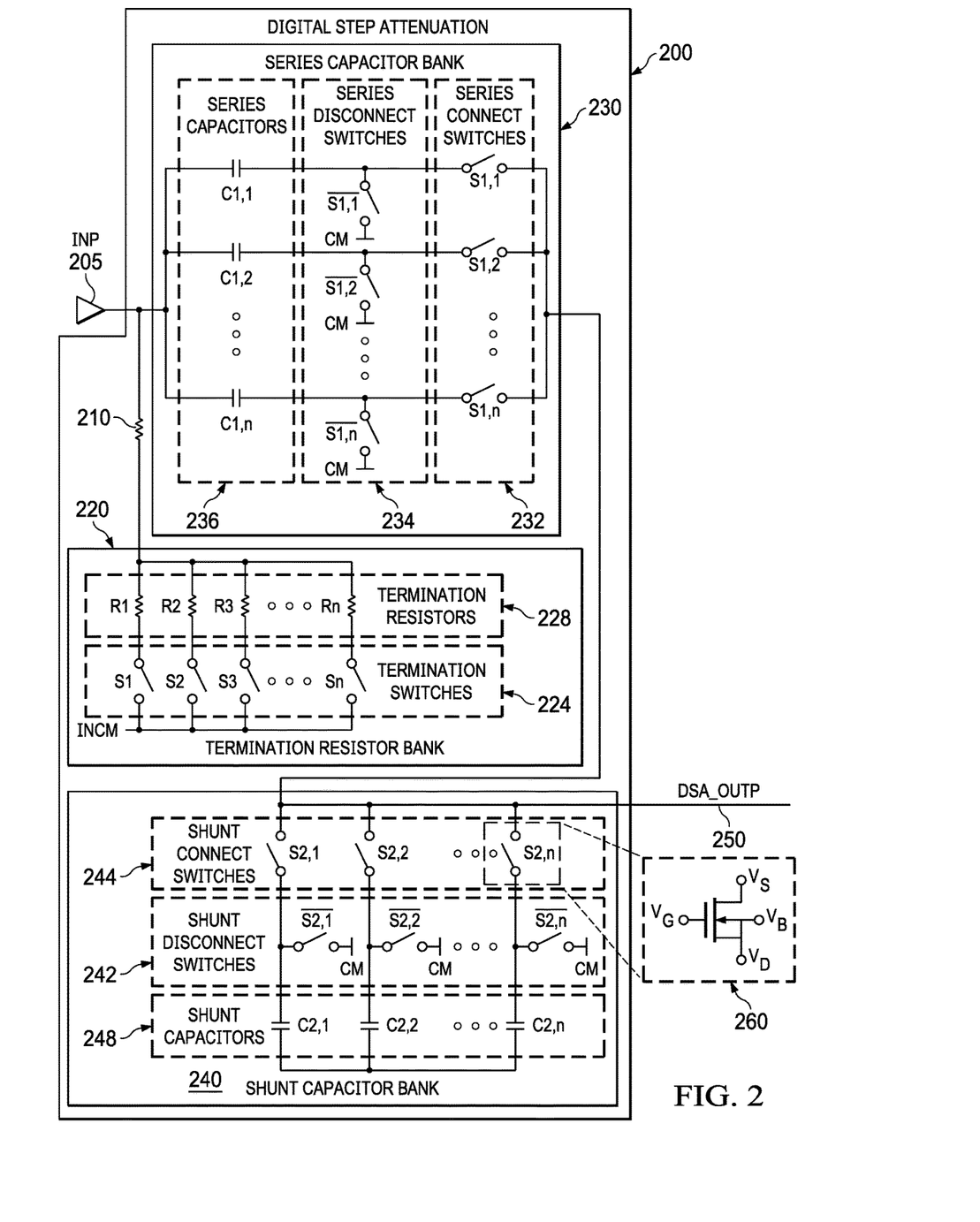
FIG. 2 shows an example digital step attenuator (DSA).

FIG. 2 shows an example digital step attenuator (DSA) 200. Example DSA 200 can be used as DSA 120 in RF receiver 100 described herein in FIG. 1. DSA 200 receives an input signal at an input terminal INP 205, and outputs an attenuated signal at an output terminal DSA_OUTP 250. DSA 200 includes a termination resistor bank 220, a series capacitor bank 230, and a shunt capacitor bank 240. Termination resistor bank 220 includes a series resistor 210, set of n termination resistors 228, including resistors R1 through Rn, and a set of n termination switches 224. The set of n termination switches 224 includes a switch for each termination resistor, switches S1 through Sn, and connects the associated termination resistors to a fixed input common mode voltage INCM when closed.

Series capacitor bank 230 includes a set of n series capacitors 236, including capacitors C1,1 through C1,n, a set of n series connect switches 232, and a set of n series disconnect switches 234. The set of n series connect switches 232 includes a switch for each capacitor in the set of series capacitors 236, switches S1,1S1,1 S1,1 through S1,n, and connects the associated capacitors to DSA_OUTP 250. The set of n disconnect switches 234 includes a switch for each capacitor in the set of series capacitors 236, switches $\overline{S1,1}$ through $\overline{S1,n}$, and connects the associated capacitors to a fixed common mode voltage, CM, disconnecting the associated capacitors from DSA_OUTP 250. The connect switch S1,x and disconnect switch S1,x for a particular capacitor C1,x in series capacitor bank 230 cannot both be closed at the same time.

Shunt capacitor bank 240 includes a set of n shunt capacitors 248, including capacitors C2,1 through C2,n, a set of shunt connect switches 244, and a set of shunt disconnect switches 242. The set of n shunt connect switches 244 includes a switch for each capacitor in the set of shunt capacitors 248, switches S2,1 through S2,n, and connects the associated capacitors to DSA_OUTP 250. The set of n disconnect switches 242 includes a switch for each capacitor in the set of shunt capacitors 248, switches $\overline{S2,1}$ through $\overline{S2,n}$, and connects the associated capacitors to a fixed common mode voltage, CM, disconnecting the associated capacitors from DSA_OUTP 250. The connect switch S2,x and disconnect switch $\overline{S2,x}$ for a particular capacitor C2,x in shunt capacitor bank 240 cannot both be on at the same time. While termination resistor bank 220, series capacitor bank 230, and shunt capacitor bank 240 are each described as having n capacitors or resistors, they need not each have the same number. In some examples, each bank has a different number of capacitors or resistors respectively.

In some examples, each switch in termination switches 224, series connect switches 232, series disconnect switches 234, shunt connect switches 244, and shunt disconnect switches 242 includes a transistor. Offset 260 illustrates an example where shunt switch S2,n includes a metal oxide semiconductor field effect transistor (MOSFET) 265 and includes a gate terminal to receive a gate voltage Vg, a source terminal to receive a source voltage Vd, and a drain terminal to receive a drain voltage. Offset 260 shows the bulk voltage terminal of transistor 265 to receive a bulk voltage Vb. Transistor 265 is an n-type MOSFET (NMOS) in this example. In other examples, transistor 265 comprises a bipolar junction transistor and includes a control input (base) and a pair of current terminals (collector and emitter). In some examples, each transistor is a core transistor, with relatively low parasitic impedance but only a one volt peak to peak swing while INP 205 can receive as much as seven volts peak to peak. The value of termination resistor bank 220 may be chosen to keep series connect switches 232 within the one volt differential.

The operation of DSA 200 is described below in the context of RF receiver 100 of FIG. 1. DSA 200 receives an input signal 118 from input driver 102 at INP 205 and outputs attenuated signal 122 at DSA_OUTP 250. Based on an attenuation setting received by DSA 200, select switches within the set of termination switches 224, the set of series connect switches 232, the set of series disconnect switches 234, the set of shunt disconnect switches 242 and the set of shunt connect switches 244 are closed or opened to adjust the total termination resistance value, the total series capacitance value, and the total shunt capacitance value. The gate control voltage applied to the series connect switches 232 and shunt connect switches 244, the switches connected to DSA_OUTP 250, track the attenuated signal 122 voltage to improve the linearity and noise figure of DSA 200, and to reduce loss due to parasitics. In some embodiments, the bulk control voltage applied to all switches, termination switches 224, series connect switches 232, series disconnect switches 234, shunt disconnect switches 242 and shunt connect switches 244, also tracks the attenuated signal 122 to further improve the linearity and noise figure of DSA 200.

Figure 3:
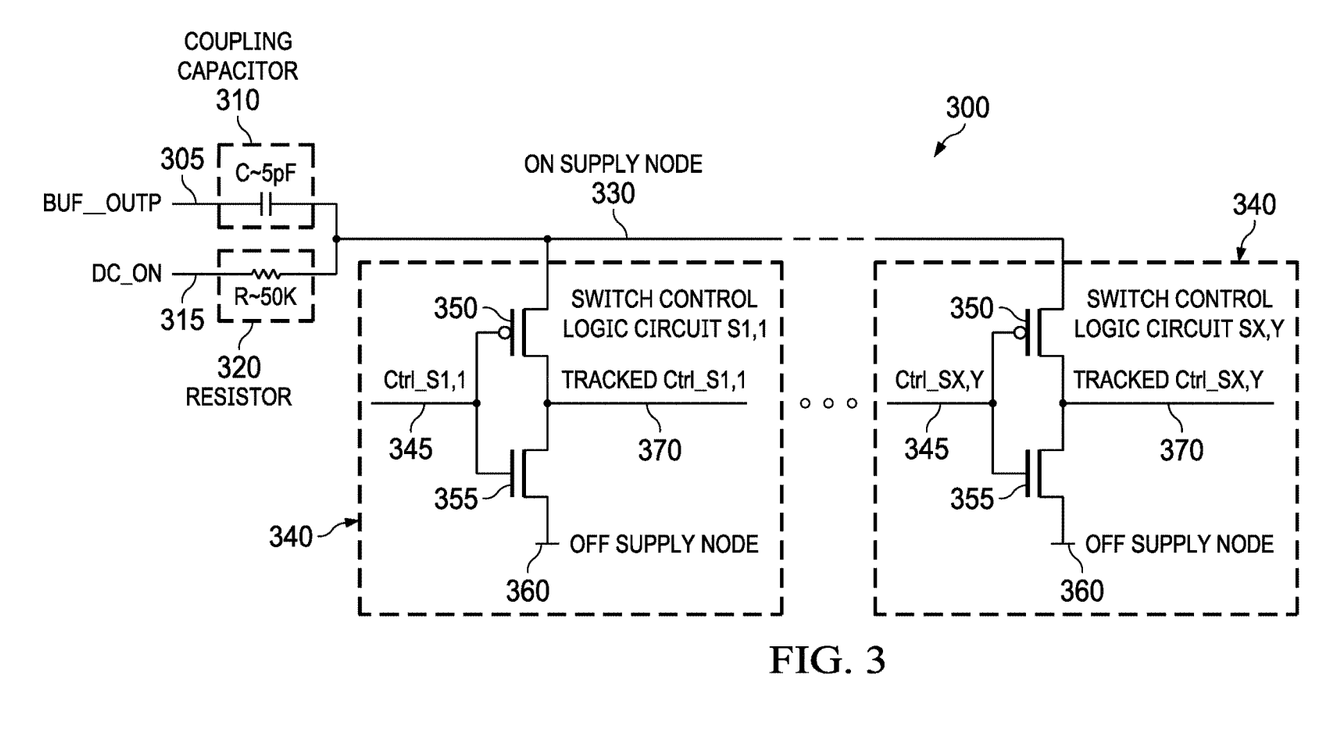
FIG. 3 shows an example DSA switch control block.

FIG. 3 shows an example DSA switch control block 300, which will be described in connection with DSA 200, illustrated in FIG. 2. Example DSA switch control block 300 can be used as DSA switch control block 135 in RF receiver 100 described herein in FIG. 1. DSA switch control block 300 includes an input terminal BUF_OUTP 305, an input terminal DC_ON 315, a coupling capacitor 310, a resistor 320, an ON supply node 330, and one or more gate control logic circuits 340. DSA switch control block 300 includes a switch control logic circuit 340 for each switch within the set of termination switches 224, the set of series connect switches 232, the set of series disconnect switches 234, the set of shunt disconnect switches 242, and the set of shunt connect switches 244 to enable bulk control tracking, and a switch control logic circuit 340 for each switch within the set of series connect switches 232 and the set of shunt connect switches 244 to enable gate control tracking. Each switch control logic circuit 340 includes an input terminal 345 for a control signal, either a bulk control signal or a gate control signal, for a particular switch associated with the switch control logic circuit 340, a first transistor 350, a second transistor 355, an input terminal OFF supply node 360, and an output terminal 370 for a tracked switch control signal to the particular switch.

In this example, two switch control logic circuits 340 are shown, one of which provides a tracked gate control signal to switch S1,1 in the set of series connect switches 232 when the switch is on while the other provides a tracked bulk control signal to switch Sx,y in any of the set of termination switches 224, series connect switches 232, series disconnect switches 234, shunt disconnect switches 242, and shunt connect switches 244 when the switch is on. The switch control logic circuit 340 for switch S1,1 includes an input terminal Ctrl_S1,1 345 for a gate control signal to switch S1,1 and an output terminal Tracked Ctrl_S1,1 370 for a tracked gate control signal to switch S1,1. The switch control logic circuit 340 for switch Sx,y includes an input terminal Ctrl_Sx,y 345 for a bulk control signal to switch Sx,y and an output terminal Tracked Ctrl_Sx,y 370 for a tracked bulk control signal to switch Sx,y.

BUF_OUTP 305 receives the attenuated output signal from a buffer, such as buffer 124 and attenuated signal 122 described herein with reference to FIG. 1. Coupling capacitor 310 is connected to BUF_OUTP 305 and to ON supply node 330. Resistor 320 is connected to DC_ON 315 and to ON supply node 330. Transistor 350 and transistor 355 in the example of FIG. 3 comprise metal oxide semiconductor field effect transistors (MOSFETs) and each include a gate terminal, a source terminal, and a drain terminal. Transistor 350 is a p-type MOSFET (PMOS) and its source terminal is connected to ON supply node 330, its gate terminal is connected to Ctrl_S1,1 345, and its drain terminal is connected to Tracked Ctrl_S1,1 370. In some embodiments, the frequency of the attenuated output signal from the buffer applied to BUF_OUTP 305 is as large as 6 GHz and transistor 350 must be large enough to track the attenuated output signal.

Transistor 355 is an n-type MOSFET (NMOS) in this example and its source terminal is connected to OFF supply node 360, its gate terminal is connected to Ctrl_S1,1 345, and its drain terminal is connected to Tracked Ctrl_S1,1 370. Transistor 355 need not be so large as transistor 350 since it does not track the output signal. Transistors 350 and 355 in the example of FIG. 3 comprise MOSFET transistors. In other examples, transistors 350 and 355 comprise bipolar junction transistors and include a control input (base) and a pair of current terminals (collector and emitter).

FIG. 3 shows only part of example DSA switch control block 300, only two switch control logic circuits 340, but DSA switch control block 300 includes a switch control logic circuit 340 for each switch in the DSA connected to DSA switch control block 300. For example, where DSA switch control block 300 is used in conjunction with DSA 200 described herein in FIG. 2, example DSA switch control block 300 includes a switch control logic circuit 340 for each switch in the set of series connect switches 232, the set of series disconnect switches 234, the set of shunt disconnect switches 242, and the set of shunt connect switches 244 to enable bulk control tracking and a switch control logic circuit 340 for each switch in the set of series connect switches 232 and the set of shunt connect switches 244 to enable gate control tracking. The switch control logic circuit 340 for each switch connects to ON supply node 330 and provides a tracked control signal to the switch. DSA switch control block 300 reduces signal loss through DSA 200 due to switch parasitics by enabling the gate control voltage to each switch connected to the DSA output to track the output signal. This improves linearity and the noise figure of DSA 200, and enables support for large output signal swing. DSA switch control block 300 also allows the threshold voltage of each switch in DSA 200 to remain largely constant despite fluctuations of the DSA output signal. This improves the linearity of DSA 200 by keeping the switch's impedance relatively constant.

Figure 4:
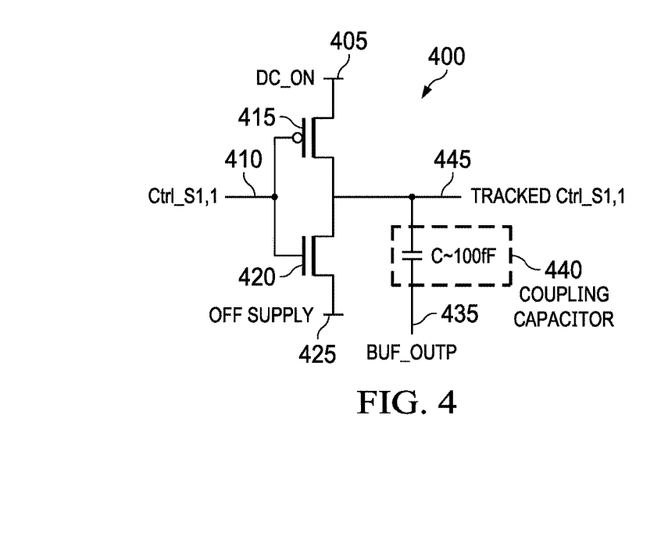
FIG. 4 shows another example DSA switch control block.

FIG. 4 shows another example DSA switch control block 400, which will be described in connection with DSA 200, illustrated in FIG. 2. Example DSA switch control block 400 can be used as DSA switch control block 135 in RF receiver 100 described herein in FIG. 1. DSA switch control block 400 provides a tracked gate control signal to a switch, in this example, switch S1,1 in the set of series connect switches 232. DSA switch control block 400 includes an input terminal DC_ON 405 to receive an on supply voltage, an input terminal Ctrl_S1,1 410 to receive a gate control signal for a switch, in this example switch S1,1, a first transistor 415, a second transistor 420, an input terminal OFF supply 425 to receive an off supply voltage, an input terminal BUF_OUTP 435 to receive the output signal from a buffer, a coupling capacitor 440, and an output terminal Tracked Ctrl_S1,1 445 to output the tracked gate control signal to a switch, in this example switch S1,1.

Transistor 415 and transistor 420 in the example of FIG. 4 comprise metal oxide semiconductor field effect transistors (MOSFETs) and each include a gate terminal, a source terminal, and a drain terminal. Transistor 415 is a p-type MOSFET (PMOS) and its source terminal is connected to DC_ON 405, its gate terminal is connected to Ctrl_S1,1 410, and its drain terminal is connected to Tracked Ctrl_S1,1 445. Transistor 420 is an n-type MOSFET (NMOS) and its source terminal is connected to OFF supply 425, its gate terminal is connected to Ctrl_S1,1 410, and its drain terminal is connected to Tracked Ctrl_S1,1 445. Transistors 415 and 420 in the example of FIG. 4 comprise MOSFET transistors. In other examples, transistors 415 and 420 comprise bipolar junction transistors and include a control input (base) and a pair of current terminals (collector and emitter). Transistors 415 and 420 are small and relatively high impedance. In some examples, transistors 415 and 420 have an impedance between 50 and 100 kn. Transistors 415 and 420 need not be as large as transistor 350 in DSA switch control block 300 described herein in FIG. 3 because they need not pass the output signal from a buffer received at BUF_OUTP 435.

BUF_OUTP 435 receives the output signal from a buffer, such as buffer 124 and attenuated signal 122 described herein with reference to FIG. 1. Coupling capacitor 440 is connected to BUF_OUTP 435 and to Tracked Ctrl_S1,1 445. Because the buffer output signal is connected directly to the output terminal for the tracked gate control signal to switch S1,1, both the on signal and off signal to switch S1,1 will track the output signal, reducing signal loss through DSA 200 due to switch parasitics and improving the linearity and noise figure of DSA 200. DSA switch control block 400 provides a tracked gate control signal to only a single switch; a separate DSA switch control block 400 must be included for each switch in the set of series connect switches 232 and the set of shunt connect switches 244. However, because small transistors and capacitors are used in DSA switch control block 400, the additional area required for a separate DSA switch control block for each switch is feasible within the confines of an integrated circuit (IC).

Figure 5:
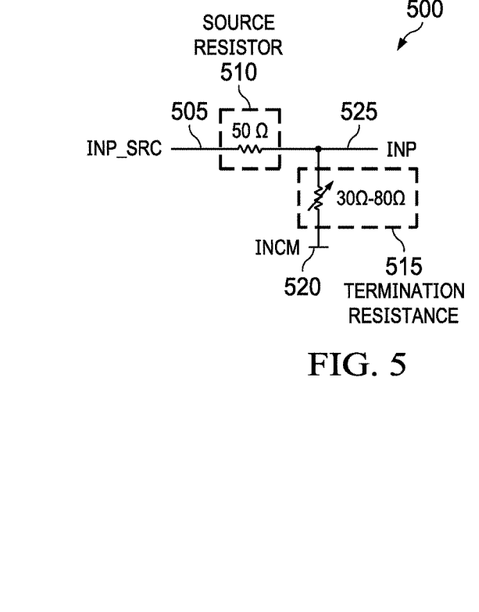
FIG. 5 shows an example termination resistance for use in a DSA.

FIG. 5 shows an example termination resistance 500 for use in a DSA, such as DSA 200 described herein in FIG. 2. Some DSAs use fixed termination resistance across all attenuation settings and RF frequencies. However, where the RF frequency is greater than 2 GHz, switches within the DSA are limited by internal parasitics from capacitors and inductors more than by internal termination resistance. Further, fixed termination resistance requires all attenuation by the DSA to be realized using capacitor attenuation alone. In contrast, termination resistance 500 allows the termination resistance value to vary, improving the attenuation range and the noise figure of the DSA using it and keeping voltages applied to series connect switches 232 within acceptable limits, such as one volt peak to peak.

Termination resistance 500 includes input terminal INP_SRC 505 to receive an input voltage for the IC, a source resistor 510, a variable termination resistance 515, an input terminal INCM 520 to receive an input common mode voltage, and an output terminal INP 525 to output the resistor-divided input voltage. INP 525 also receives an input signal, such as input signal 118 from input driver 102 as described in FIG. 1. Source resistor 510 is connected to INP_SRC 505 and to INP 525 and represents an internal resistance associated with the voltage source supplying the input voltage to INP_SRC 505. Termination resistance 515 is connected to INCM 520 and to INP 525. In example termination resistance 500, source resistor 510 has a value of 50Ω and termination resistance 515 varies between 30-80Ω. Termination resistance 515 may be set to 80Ω for a 0 dB, minimal attenuation DSA setting to compensate for signal losses due to parasitic capacitors within the DSA, improving the noise figure of the DSA. Termination resistance 515 may be set to 30Ω for maximum attenuation settings.

Figure 6:
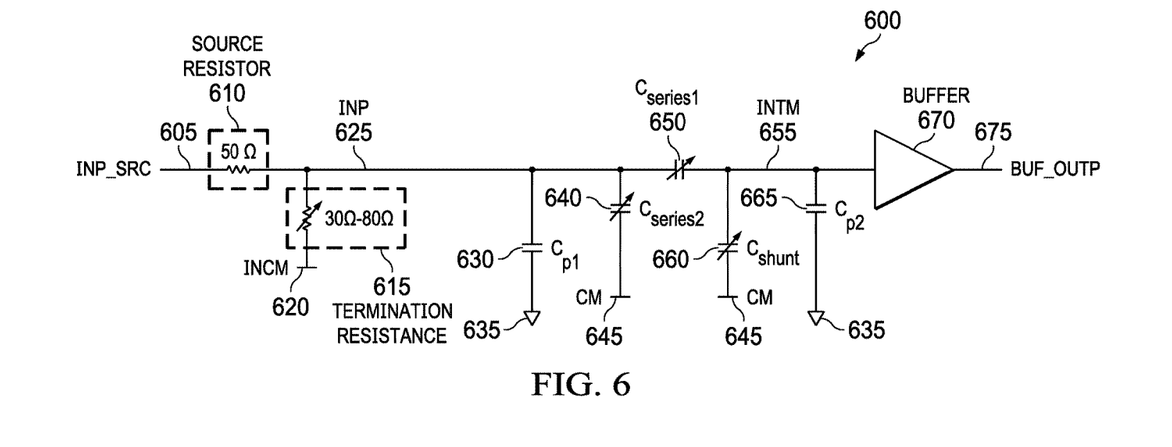
FIG. 6 shows a simplified example DSA.

FIG. 6 shows an example DSA 600, which includes an input terminal INP_SRC 605 to receive an input voltage for the IC, a source resistor 610, a variable termination resistance 615, an input terminal INCM 620 to receive an input common mode voltage, a node and input terminal INP 625 to receive an input signal, such as input signal 118 from input driver 102 as described in FIG. 1, a first parasitic capacitance Cp1 630, an input terminal 635 to receive a fixed voltage, a variable capacitor CSeries2 640, an input terminal CM 645 to receive a common mode voltage, a variable capacitor CSeries1 650, an intermediate node INTM 655, a variable capacitor CShunt 660, a second parasitic capacitance Cp2 665, a buffer 670, and an output terminal BUF_OUTP 675. Source resistor 610 is connected to INP_SRC 605 and INP 625 and represents an internal resistance associated with the voltage source supplying the input voltage to INP_SRC 605. Termination resistance 615 is connected to INP 625 and INCM 620. Cp1 630 is connected to INP 625 and fixed voltage node 635 and represents the parasitic capacitance of components in the circuit. Cseries2 640 is connected to INP 625 and CM 645. CSeries1 650 is connected to INP 625 and intermediate node INTM 655. CShunt 660 is connected to intermediate node INTM 655 and CM 645. Cp2 665 is connected to intermediate node INTM 655 and fixed voltage node 635. Buffer 670 is connected to intermediate node INTM 655 and BUF_OUTP 675.

To ensure a similar frequency response across all attenuation settings, the time constants associated with DSA 600 must be substantially the same across all attenuation settings. Only two time constants are involved in the signal path from INP_SRC to BUF_OUTP 675. One time constant, τin, is associated with the effective input resistance and effective input capacitance of DSA 600 and is represented as:

$$\tau in = (Rsrc\|Rterm)*(Cp1 + CSeries1 + CSeries2 \sim [CShunt + Cp2])$$

The other time constant, τout, is associated with the effective buffer output impedance and output capacitance of DSA 600 and is represented as:

$$\tau out = gm(buf) * \frac{Cgs(buf)}{(Cin(buf) + Cgs(buf))}$$

where gm(buf) represents the transconductance of buffer 670, Cgs(buf) represents the gate to source capacitance of the buffer, and Cin(buf) represents the output capacitance of DSA 600 and may be written as:

$$Cin(buf) = Cp2 + CShunt + (CSeries1 \sim [Cp1 + CSeries2])$$

The attenuation of DSA 600 depends on the values of source resistor 610, termination resistance 615, capacitor CSeries1 650, capacitor CShunt 660, and capacitor Cp2 665, and is represented as:

$$\alpha = \left(\frac{Rterm}{Rterm + Rsrc}\right) * \left(\frac{CSeries1}{CSeries1 + CShunt + Cp2}\right)$$

As may be seen, there are many combinations of R and C values to achieve the same attenuation. The values of termination resistance 615, capacitor CSeries1 650, and capacitor CShunt 660 for each attenuation setting are chosen such that τin and τout are substantially constant. This in turn ensures the frequency response of DSA 600 is relatively constant across attenuation levels and DSA switch settings to achieve the attenuation levels.

Figure 7A:
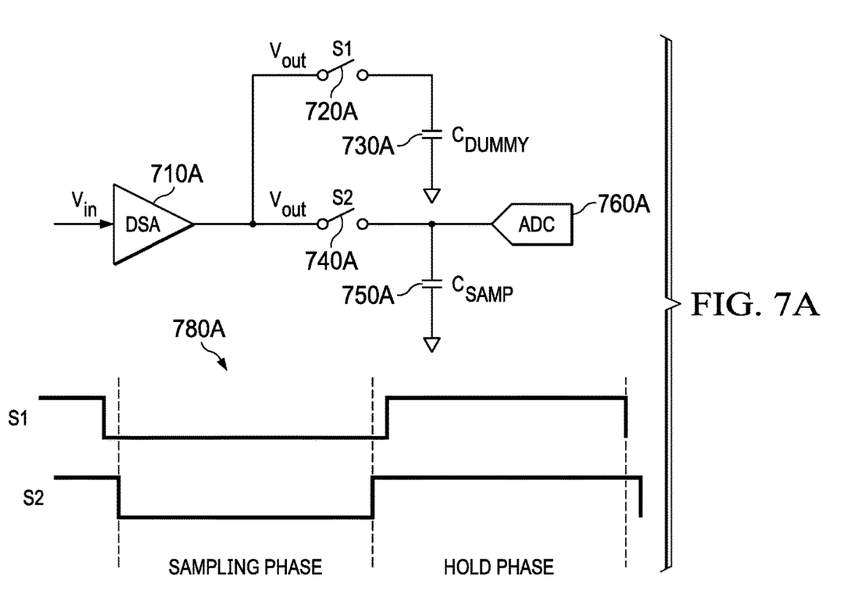
FIGS. 7A-B show two example sampling configurations for a DSA and an analog to digital (ADC) converter.
Figure 7B:
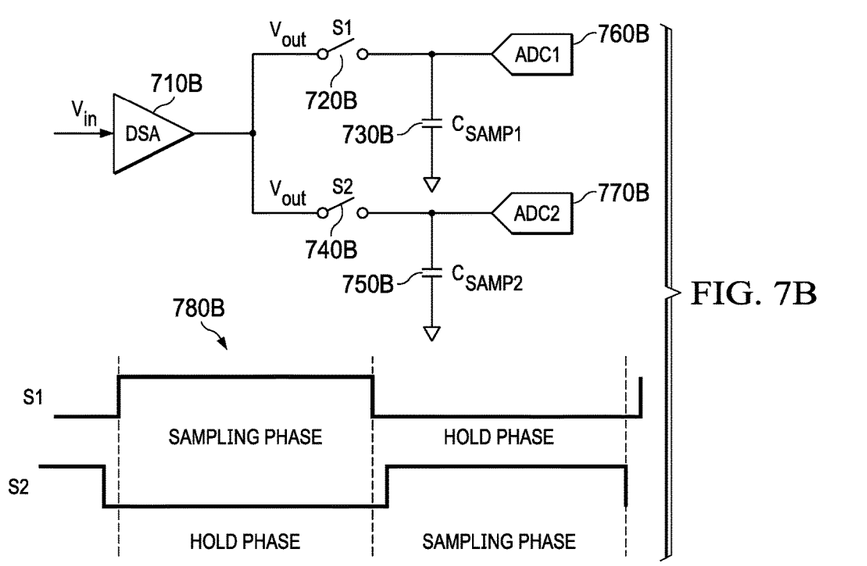

FIGS. 7A-B show two example sampling configurations for a DSA and an ADC converter, such as DSA 200 described in FIG. 2 and ADC 128 described in FIG. 1. FIG. 7A shows an example sampling configuration in which switch S1 720A attaches a dummy capacitance 730A to DSA 710A and switch S2 740A connects a sampling capacitance 750A and ADC 760A to DSA 710A. In anticipation of a sampling phase, switch S1 opens, disconnecting the dummy capacitance 730A from DSA 710A. During the sampling phase, switch S2 closes and sampling capacitance 750A is charged by the signal output by DSA 710A while switch S1 remains open. During a hold phase, switch S2 opens, disconnecting sampling capacitance 750A from DSA 710A, and switch S1 closes in response to switch S2 opening, connecting dummy capacitance 730A to the DSA 710A and charging it with the signal output by DSA 710A. Switches S1 and S2 are not closed at the same time. During the hold phase, the charge accumulated in sampling capacitance 750A is provided to ADC 760A. Timing graph 780A shows the times at which switches S1 and S2 close and open during an example sampling phase and hold phase. As may be seen, switch S1 opens before switch S2 closes in the sampling phase and closes after switch S2 opens in the hold phase.

FIG. 7B shows another example sampling configuration in which two ADCs are connected to the DSA to simulate continuous time sampling. Switch S1 720B connects a first sampling capacitance 730B and ADC1 760B to DSA 710B. Switch S2 740B connects a second sampling capacitance 750B and ADC2 770B to DSA 710B. The hold and sampling phases of sampling capacitance 730B and 750B are opposite each other, such that they are not both in a sampling phase at the same time. In anticipation of a sampling phase for sampling capacitance 730B, switch S2 opens, disconnecting sampling capacitance 750B and ADC2 770B from DSA 710B and putting them in a hold phase, during which the charge accumulated on sampling capacitance 750B is provided to ADC2 770B. Then switch S1 closes, charging sampling capacitance 730B with the signal output by DSA 7106. In anticipation of a sampling phase for sampling capacitance 750B, switch S1 opens, disconnecting sampling capacitance 730B and ADC1 760B from DSA 7106 and putting them in a holding phase, during which the charge accumulated on sampling capacitance 730B is provided to ADC1 760B. Switches S1 and S2 are not closed at the same time. As may be seen in timing graph 780B, switch S2 opens before switch S1 closes for the sampling phase of sampling capacitance 730B and closes after switch S1 opens for the sampling phase of sampling capacitance 750B.

Figure 8:
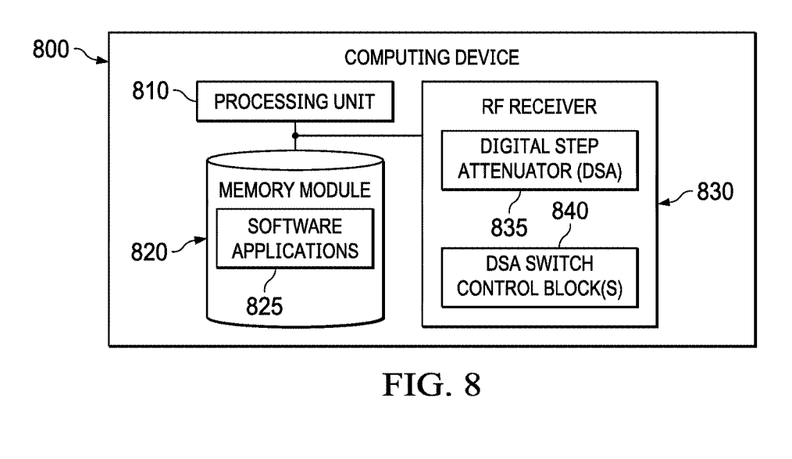
FIG. 8 shows an example computing device.

FIG. 8 illustrates a computing device 800. The computing device 800 is, or is incorporated into, a mobile communication device, such as a mobile phone, personal digital assistant, a transceiver, a personal computer, or any other type of electronic system. The computing device 800 can include one or more additional components known to those skilled in the relevant art and are not discussed here for simplicity of the description. In some embodiments, the computing device 800 comprises a megacell or a system-on-chip (SoC) which includes a processing unit 810 such as a central processing unit (CPU), and a memory module 820 (e.g., a random access memory (RAM)). The processing unit 810 can be, for example, a Complex Instruction Set Computer (CISC) type CPU, a Reduced Instruction Set Computer (RISC) type CPU, a digital signal processor (DSP) or any other appropriate processing unit.

The memory module 820 can be memory such as RAM, flash memory, disk storage, and the like, and stores one or more software applications 825 that, when executed by processing unit 810, perform any suitable function associated with computing device 800. Processing unit 810 typically comprises memory and logic which stores information frequently accessed from memory module 820. Computing device 800 includes an RF receiver 830. RF receiver 830 is coupled to processing unit 810 and memory module 820. RF receiver 830 includes a digital step attenuator 835 and one or more DSA switch control blocks 840.

DSA 835 is similar in connection and operation to DSA 200 described herein in FIG. 2. DSA 835 includes an input terminal INP and an output terminal DSA_OUTP. INP is coupled to an input driver, which is similar in connection and operation to input driver 102 shown in FIG. 1. DSA_OUTP is connected to a buffer, such as buffer 124 shown in FIG. 1. DSA 835 includes a series resistor, a termination resistor bank, a series capacitor bank, and a shunt capacitor bank. The series resistor is coupled to INP and the termination resistor bank, which is further connected to a fixed voltage terminal. The series capacitor bank is connected to INP and DSA_OUTP. The shunt capacitor bank is connected to DSA_OUTP and a fixed voltage terminal. DSA 835 enables linear, low noise, high dynamic range continuous time capacitive attenuation of signals input to DSA 835.

The DSA switch control blocks 840 are similar in connection and operation to DSA switch control logic circuits 300 and 400 described herein in FIGS. 3 and 4 and include an input terminal BUF_OUTP and an output terminal Tracked_Ctrl for one or more switches in DSA 835. BUF_OUTP is coupled to a buffer, such as buffer 124 shown in FIG. 1, and receives the output signal from the buffer. In some embodiments, a single BUF_OUTP input terminal enables output signal tracking for the gate control signal of each switch in DSA 835 connected to the DSA output and for the bulk control signal of every switch in DSA 835. In other embodiments, RF receiver 830 includes a DSA switch control block 840 for each switch in DSA 835 connected to the DSA output and enables output signal tracking for the gate control signal of the associated switch.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An RF receiver comprising:
   an input driver configured to receive a coarse signal, and configured to generate an input signal;
   a digital step attenuator (DSA) coupled to the input driver, configured to receive the input signal, and configured to generate an attenuated signal;
   a buffer coupled to the DSA, configured to receive the attenuated signal, and configured to output the attenuated signal; and
   an analog to digital converter (ADC) coupled to the buffer, configured to receive the attenuated signal from the buffer, and configured to generate an output signal, wherein the DSA further comprises:
      a termination resistor bank coupled to the input driver,
      a series capacitor bank coupled to the input driver and the buffer, and
      a shunt capacitor bank coupled to the buffer.

2. The RF receiver of claim 1, wherein the termination resistor bank, the series capacitor bank, and the shunt capacitor bank are configured to attenuate the input signal to generate the attenuated signal.

3. The RF receiver of claim 2, wherein a resistance value of the termination resistor bank, a capacitance value of the series capacitor bank, and a capacitance value of the shunt capacitor bank for each attenuation setting are configured to maintain a frequency response of the DSA.

4. The RF receiver of claim 1, wherein the DSA further comprises a series resistor coupled between the input driver and the termination resistor bank.

5. The RF receiver of claim 4, wherein the termination resistor bank comprises:
   a set of one or more termination resistors coupled to the series resistor; and
   a set of termination switches coupled between the set of one or more termination resistors and a fixed voltage terminal, each termination switch coupled between a termination resistor and the fixed voltage terminal.

6. The RF receiver of claim 1, wherein the series capacitor bank comprises:
   a set of one or more series capacitors coupled to the input driver;
   a set of series connect switches coupled between the set of one or more series capacitors and the buffer, each series connect switch coupled between a series capacitor and the buffer; and
   a set of series disconnect switches coupled between the set of one or more series capacitors and a fixed voltage terminal, each series disconnect switch coupled between a series capacitor and the fixed voltage terminal.

7. The RF receiver of claim 1, wherein the shunt capacitor bank comprises:
   a set of one or more shunt capacitors;
   a set of shunt connect switches coupled between the set of one or more shunt capacitors and the buffer, each shunt connect switch coupled between a shunt capacitor and the buffer and
   a set of shunt disconnect switches coupled between the set of one or more shunt capacitors and a fixed voltage terminal, each shunt disconnect switch coupled between a shunt capacitor and the fixed voltage terminal.

8. The RF receiver of claim 1, further comprising a DSA switch control circuit coupled to the buffer, configured to receive the attenuated signal from the buffer, and configured to generate tracked switch control signals, the tracked switch control signals are provided to terminals of one or more switches within the DSA.

9. The RF receiver of claim 8, wherein a tracked switch control signal is provided to a bulk terminal of each switch within the DSA.

10. The RF receiver of claim 8, wherein a tracked switch control signal is provided to a gate terminal of each switch within the DSA connected to the buffer.

11. The RF receiver of claim 8, wherein the DSA switch control circuit comprises:
    a first input terminal configured to receive the attenuated signal from the buffer;
    a coupling capacitor coupled to the first input terminal and a first node;
    a resistor coupled to a first fixed supply voltage and the first node; and
    a switch control logic sub-circuit for each of one or more switches within the DSA, each switch control logic sub-circuit coupled to the first node, configured to receive a control signal for an associated switch within the DSA, and configured to generate the tracked switch control signal for the associated switch.

12. The RF receiver of claim 11, wherein each switch control logic sub-circuit comprises:
    a first transistor configured to receive the control signal for the associated switch, the first transistor coupled to the first node and an output node; and a second transistor configured to receive the control signal for the associated switch, the second transistor coupled to a second fixed supply voltage and the output node, wherein the output node is coupled to the associated switch and provides the tracked control signal to a terminal of the associated switch.

13. The RF receiver of claim 8, wherein the DSA switch control circuit comprises:

a first transistor configured to receive a control signal for a switch within the DSA, the first transistor coupled to a first fixed voltage and an output terminal;

a second transistor configured to receive the control signal for the switch, the second transistor coupled to a second fixed voltage and the output terminal;

an input terminal configured to receive the attenuated signal from the buffer; and a coupling capacitor coupled to the output terminal and the input terminal, wherein the output terminal is coupled to the switch and provides the tracked control signal to a gate terminal of the switch.

14. A digital step attenuator (DSA), comprising:

a first input terminal configured to receive an input signal;

a termination resistor bank coupled to the first input terminal and comprising:

a series resistor coupled to the first input terminal, a set of one or more termination resistors coupled to the series resistor, and a set of termination switches coupled between the set of one or more termination resistors and a first fixed voltage terminal, each termination switch coupled between a termination resistor and the first fixed voltage terminal;

a series capacitor bank coupled to the first input terminal and a first output terminal; and a shunt capacitor bank coupled to the first output terminal, wherein the first output terminal is configured to provide an attenuated signal.

15. The DSA of claim 14, wherein the termination resistor bank, the series capacitor bank, and the shunt capacitor bank are configured to attenuate the input signal to generate the attenuated signal.

16. The DSA of claim 15, wherein a resistance value of the termination resistor bank, a capacitance value of the series capacitor bank, and a capacitance value of the shunt capacitor bank for each attenuation setting are configured to maintain a frequency response of the DSA.

17. The DSA of claim 14, further comprising a DSA switch control circuit, configured to receive a buffered signal, and configured to generate tracked switch control signals, the tracked switch control signals are provided to terminals of one or more switches within the DSA.

18. The DSA of claim 17, wherein a tracked switch control signal is provided to a bulk terminal of each switch within the DSA.

19. The DSA of claim 17, wherein a tracked switch control signal is provided to a gate terminal of each switch within the DSA connected to the first output signal.

20. The DSA of claim 17, wherein the DSA switch control circuit comprises:

a second input terminal configured to receive the buffered signal;

a coupling capacitor coupled to the second input terminal and a first node;

a resistor coupled to a second fixed supply voltage and the first node; and a switch control logic sub-circuit for each switch within the DSA, each switch control logic sub-circuit coupled to the first node, configured to receive a control signal for an associated switch within the DSA, and configured to generate the tracked switch control signal for the associated switch.

21. The DSA of claim 20, wherein each switch control logic sub-circuit comprises:

a first transistor configured to receive the control signal for the associated switch, the first transistor coupled to the first node and a second output terminal; and a second transistor configured to receive the control signal for the associated switch, the second transistor coupled to a third fixed supply voltage and the second output terminal, wherein the second output terminal is coupled to the associated switch and provides the tracked switch control signal to a terminal of the associated switch.

22. The DSA of claim 17, wherein the DSA switch control circuit comprises:

a first transistor configured to receive a control signal for a switch within the DSA, the first transistor coupled to a second fixed voltage and a second output terminal;

a second transistor configured to receive the control signal for the switch, the second transistor coupled to a third fixed voltage and the second output terminal;

a second input terminal configured to receive the buffered signal; and a coupling capacitor coupled to the second input terminal and the second output terminal, wherein the second output terminal is coupled to the switch and provides the tracked switch control signal to a terminal of the switch.

23. A computing device comprising:

a processing unit;

a memory module coupled to the processing unit an RF receiver coupled to the processing unit and the memory module, the RF receiver further comprising:

an input driver configured to receive a coarse signal, and configured to generate an input signal;

a digital step attenuator (DSA) coupled to the input driver, configured to receive the input signal, and configured to generate an attenuated signal, wherein the DSA comprises:

a termination resistor bank coupled to the input driver, a series capacitor bank coupled to the input driver and a buffer, and a shunt capacitor bank coupled to the buffer;

the buffer coupled to the DSA, configured to receive the attenuated signal, and configured to output the attenuated signal; and an analog to digital converter (ADC) coupled to the buffer, configured to receive the attenuated signal from the buffer, and configured to generate an output signal.

24. The computing device of claim 23, wherein the RF receiver further comprises a DSA switch control circuit coupled to the buffer, configured to receive the attenuated signal from the buffer, and configured to generate tracked switch control signals, the tracked switch control signals are provided to terminals of one or more switches within the DSA.

25. The computing device of claim 24, wherein the DSA switch control circuit comprises:

an input terminal configured to receive the attenuated signal from the buffer;

a coupling capacitor coupled to the input terminal and a first node;
a resistor coupled to a first fixed supply voltage and the first node; and
a switch control logic sub-circuit for each switch within the DSA, wherein each switch control logic sub-circuit is coupled to the first node, configured to receive a control signal for an associated switch within the DSA, and configured to generate the tracked switch control signal for the associated switch, and wherein each switch control logic sub-circuit comprises:
  a first transistor configured to receive the control signal for the associated switch, the first transistor coupled to the first node and an output node, and
  a second transistor configured to receive the control signal for the associated switch, the second transistor coupled to a second fixed supply voltage and the output node,
  wherein the output node is coupled to the associated switch and provides the tracked switch control signal to a terminal of the associated switch.

26. The computing device of claim 24, wherein the RF receiver further comprises a DSA switch control circuit for each of one or more switches within the DSA and wherein each DSA switch control circuit comprises:
  a first transistor configured to receive a control signal for an associated switch within the DSA, the first transistor coupled to a first fixed supply voltage and an output terminal;
  a second transistor configured to receive the control signal for the associated switch, the second transistor coupled to a second fixed supply voltage and the output terminal;
  an input terminal configured to receive the attenuated signal from the buffer; and
  a coupling capacitor coupled to the output terminal and the input terminal,
  wherein the output terminal is coupled to the associated switch and provides the tracked switch control signal to a gate terminal of the associated switch.

* * * * *